(12) United States Patent
Benner

(10) Patent No.: US 8,299,442 B2
(45) Date of Patent: Oct. 30, 2012

(54) PARTICLE BEAM APPARATUS HAVING AN ANNULARLY-SHAPED ILLUMINATION APERTURE

(75) Inventor: Gerd Benner, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 515 days.

(21) Appl. No.: 12/461,481

(22) Filed: Aug. 13, 2009

(65) Prior Publication Data

US 2010/0038537 A1 Feb. 18, 2010

(30) Foreign Application Priority Data

Aug. 14, 2008 (DE) .......................... 10 2008 037 698

(51) Int. Cl.
*G21K 5/04* (2006.01)
(52) U.S. Cl. ............. 250/396 R; 250/396 ML; 250/306; 250/310; 250/311; 250/492.3
(58) Field of Classification Search .............. 250/396 R, 250/397, 398, 396 ML, 492.1, 492.2, 492.22, 250/492.3, 306, 307, 309, 310, 311
See application file for complete search history.

(56) References Cited

U.S. PATENT DOCUMENTS

| 5,814,815 | A | 9/1998 | Matsumoto et al. | |
|---|---|---|---|---|
| 6,797,956 | B2 * | 9/2004 | Benner | 250/311 |
| 2003/0132383 | A1 * | 7/2003 | Benner | 250/311 |
| 2007/0284528 | A1 | 12/2007 | Benner et al. | |
| 2008/0035854 | A1 * | 2/2008 | Jin et al. | 250/396 R |
| 2008/0296509 | A1 | 12/2008 | Schroder et al. | |

OTHER PUBLICATIONS

Translation into English of office action dated Apr. 23, 2009 of the German Patent Office for German patent application 10 2008 037 698.1 from which this application claims priority.

* cited by examiner

*Primary Examiner* — David A Vanore
*Assistant Examiner* — Nicole Ippolito
(74) *Attorney, Agent, or Firm* — Walter Ottesen

(57) ABSTRACT

A particle beam apparatus has an optical axis (OA), an illuminating system (1, 2, 3, 4) for illuminating an object, which is positioned in an object plane (7), with a beam of charged particles and an objective (6) for imaging the illuminated object. The beam of charged particles is split at the object into a null beam and higher diffraction orders. The illuminating system is so configured that it generates an annularly-shaped illuminating aperture in a plane Fourier transformed to the object plane (7). A phase-shifting element (9) is mounted in a focal plane (15) of the objective (6) or in a plane conjugated thereto. The focal plane (15) faces away from the object plane (7). The phase-shifting element can be an einzel lens having two outer electrodes and one or several inner electrodes disposed therebetween when seen in the direction of the optical axis. The phase-shifting element can have an additional electrode at or near the optical axis.

14 Claims, 6 Drawing Sheets

PARTICLE BEAM APPARATUS HAVING AN ANNULARLY-SHAPED ILLUMINATION APERTURE

CROSS REFERENCE TO RELATED APPLICATION

This application claims priority of German patent application no. 10 2008 037 698.1, filed Aug. 14, 2008, the entire content of which is incorporated herein by reference.

FIELD OF THE INVENTION

The invention relates to a particle beam apparatus having an annularly-shaped illumination aperture, especially for viewing or image recording in transmission. With this particle beam apparatus images can be generated with phase contrast.

BACKGROUND OF THE INVENTION

U.S. Pat. No. 6,797,956 discloses a phase contrast electron microscope having phase contrast imaging. By utilizing an annularly-shaped illuminating aperture, no small components are needed for the phase-shifting element which are critical with respect to electrostatic charging and contamination compared to other phase contrast systems. However, more detailed analysis has shown that the phase shift in this known system is achieved essentially by the intense spherical aberration of the einzel lens in the peripheral region.

Additional systems for generating phase contrast in a transmission electron microscope are disclosed in United States patent application publications 2008/0296509 and 2007/0284528 and U.S. Pat. Nos. 5,814,815 and 6,797,956.

SUMMARY OF THE INVENTION

It is the object of the invention to improve the contrast generation in a particle beam apparatus having an annularly-shaped illuminating aperture compared to the known systems.

The particle beam apparatus of the invention according to a first embodiment defines an optical axis and includes: an illuminating system for illuminating an object to be positioned in an object plane with a beam of charged particles which splits into a null beam and higher diffraction orders at the object; an objective arranged along the optical axis for imaging the object illuminated by the illuminating system; the illuminating system being configured to generate, during operation, an annularly-shaped illuminating aperture in a plane fourier transformed to the object plane; the objective having a focal plane facing away from the object plane; a phase-shifting element mounted in the focal plane or a plane conjugated thereto; the phase-shifting element including an einzel lens having first and second outer electrodes arranged along the optical axis and an inner electrode arranged therebetween; and, the electrodes being arranged and charged with electrical potential, during operation, so as to cause the potential at the optical axis to correspond to the potential at the first and second outer electrodes of the einzel lens.

A second embodiment of the particle beam apparatus of the invention defines an optical axis and includes: an illuminating system for illuminating an object to be positioned in an object plane with a beam of charged particles which splits into a null beam and higher diffraction orders at the object; an objective arranged along the optical axis for imaging the object illuminated by the illuminating system; the illuminating system being configured to generate, during operation, an annularly-shaped illuminating aperture in a plane fourier transformed to the object plane; the objective having a focal plane facing away from the object plane; a phase-shifting element mounted in the focal plane or a plane conjugated thereto; the phase-shifting element including a carrier; and, an annularly-shaped electrode accommodated in the carrier; the annularly-shaped electrode having a side facing away from the optical axis in a radial direction; the electrode having an edge on the side thereof; and, the edge and the carrier conjointly defining an annular gap therebetween.

In one embodiment of the invention, the electrodes of the phase-shifting element are so arranged and charged with electrical potential during operation that the potential on the optical axis corresponds to the potential of the outer electrodes of the einzel lens. With this measure, it is ensured that electrons whose paths run further away from the optical axis run through a different potential difference than electrons whose paths run closer to the optical axis. The null beam runs in the proximity of the edges of the electrodes of the einzel lens. For this reason, it is ensured in this way that the null beam experiences another phase shift than the electrons diffracted toward the optical axis at the object.

Especially, a large-area potential distribution central to the optical axis can be brought about on the potential of the outer electrodes or on the potential of the electron optical column forward and rearward of the phase-shifting element. In this way, an intensely localized potential drop is achieved in the proximity of the edges of the inner electrode, that is, in the region wherein the null beam runs.

In a special embodiment, the particle beam apparatus has an optical axis, an illuminating system for illuminating an object to be positioned in an object plane with a beam of charged particles and an objective for imaging the illuminated object. The beam of charged particles is split on the object into a null beam and higher diffraction orders. The illuminating system can be so configured that it generates an annularly-shaped illuminating aperture during operation in a plane which is Fourier transformed to the object plane. A phase-shifting element can be mounted in a focal plane of the objective, which faces away from the object plane, or in a plane conjugated thereto. The phase-shifting element can have an einzel lens (viewed in the direction of the optical axis) having two outer electrodes and one or several inner electrodes lying therebetween. Furthermore, the phase-shifting element can have an additional electrode on or in the proximity of the optical axis.

With the additional electrode on the optical axis or in the proximity of the optical axis, this electrode can be charged with a further electrical potential which deviates from the electrostatic potential of the inner electrode of the einzel lens. In this way, it is achieved that a defined electrostatic potential is present in the central region lying closer to the optical axis which deviates in a defined manner from the electrostatic potential in the peripheral region, that is, closer to the electrodes of the einzel lens. In this way, in turn, it can be achieved that the phase shifts, which the rays experience (which rays run at different radial distances from the optical axis), deviate more intensely and with more definition from each other.

In a special embodiment, the additional electrode can be charged with the potential of the outer electrodes of the electrostatic lens. Alternatively, a separate voltage source can, however, be provided via which the additional electrode is charged with a potential deviating from the electrostatic potential of the outer electrodes of the einzel lens.

In another embodiment of the invention, the additional electrode can be accommodated on a manipulator and positioned perpendicular to the direction of the optical axis.

In a further special embodiment, the phase-shifting element can be so configured that it, during operation, imparts a phase shift to the null beam relative to the radiation diffracted at the object into higher diffraction orders and the phase-shifting element can be further configured in such a manner that it does not influence or only slightly influences the phase of the radiation diffracted at the object into higher diffraction orders with this beam running in radial direction closer to the optical axis than the null beam. Alternatively, the phase-shifting element can be so configured that it, during operation, imparts a phase shift to the radiation, which is diffracted into higher diffraction orders at the object, with respect to the null beam and the phase-shifting element can be so configured that it does not or hardly influences, during operation, the phase of the null beam.

In a further embodiment of the invention, the inner electrode has two or more segments of which two segments, which lie opposite to each other with reference to the optical axis, are charged, during operation, with potentials of mutually opposite polarities. The segments have edges facing toward the optical axis and two segments lying opposite each other with respect to the optical axis can have different distances in radial direction from the optical axis.

In another embodiment of the invention, a deflection system can be mounted in a source side plane conjugated to the object plane. This deflection system is for a time sequential generation of the annularly-shaped illuminating aperture and a supply voltage can be provided which is so configured that the segments are charged with potential alternately or rotatingly.

In a further embodiment, the einzel lens can be accommodated on a carrier. The electrodes of the einzel lens can have edges on the side facing in radial direction away from the optical axis and an annularly-shaped or annularly-segmented shaped gap can be provided between the edges of the electrodes of the einzel lens and the carrier. The inner electrode of the einzel lens can have a first annularly-shaped or annularly-segmented shaped electrode and a second annularly-shaped or annularly-segmented shaped electrode and the first annularly-shaped or annularly-segmented shaped electrode can be electrically insulated with respect to the second ring-shaped or ring-segmented shaped electrode. The second annularly-shaped or annularly-segmented shaped electrode can be mounted in radial direction outside of the first annularly-shaped or annularly-segmented shaped electrode and the second annularly-shaped or annularly-segmented shaped electrode can be charged during operation with the electric potential of the carrier. Furthermore, a voltage supply can be provided with which the first annularly-shaped or annularly-segmented shaped electrode can be charged with a potential deviating from the potential of the carrier.

In a special embodiment, the first annularly-shaped or annularly-segmented shaped electrode can have several annular segments and a deflection system can be mounted in a source side plane conjugated to the object plane with this deflection system being for a time sequential generation of the annularly-shaped illuminating aperture. Furthermore, a voltage supply can be provided which is so configured that the annular segments are charged with a potential alternately or rotatingly.

In a particle beam apparatus of the invention, the phase contrast can be generated very similarly to the generation of the phase contrast in the light microscopy. The illuminating system of the particle beam apparatus generates an annularly-shaped illuminating aperture in a plane Fourier transformed to the object plane to be imaged. As in the phase contrast light microscopy, the illumination of the object, which is to be imaged, can take place with a hollow conically-shaped beam. A phase-shifting element is mounted in the plane, which is Fourier transformed to the object plane, or in a plane conjugated thereto. The phase-shifting element can impart a phase shift to the radiation, which is undiffracted at the object (that is, the null beam), relative to the radiation diffracted at the object into higher diffraction orders. At the same time, the phase-shifting element can leave the phase of the radiation diffracted at the object into higher diffraction orders uninfluenced or only slightly influenced, which radiation runs in radial direction closer to the optical axis than the null beam.

In another embodiment, and as with phase contrast in the light microscopy, a phase shift is imparted by the phase-shifting element to the radiation, which is diffracted at the object relative to the beam undiffracted at the object. The radiation, which is diffracted at the object into higher diffraction orders and which runs closer to the optical axis in the plane of the phase-shifting element in radial direction than the radiation, which is undiffracted at the object, is not influenced by the phase-shifting element. A corresponding phase-shifting element can therefore be configured to be annularly-shaped with a central aperture. Such an annularly-shaped phase-shifting element can accordingly be held at its outer periphery so that no cantilevered or almost cantilevered structures are needed. The phase-shifting element even supplies particle-optical advantages when the phase-shifting element or a holding structure of the phase-shifting element masks out the higher diffraction orders lying further from the optical axis than the null beam in radial direction. In this way, the negative influence of the off axis aberrations of the objective is reduced.

Furthermore, the phase-shifting element influences not only the phase of the null beam but simultaneously attenuates the intensity of the null beam via a corresponding absorption. Overall, a contrast improvement is achieved via the thereby achievable intensity adaptation between the null beam and the higher diffraction orders. A very stable configuration of the phase-shifting element can be realized from a combination of the phase-shifting element with an aperture diaphragm. The radiation of higher order, which is diffracted toward the optical axis, can pass unhindered through the central opening of the phase-shifting element while the radiation, which is diffracted in radial direction away from the optical axis, is masked out. However, with this masking out, no information is lost because the illuminating beam, which is rotated by 180° with respect to the optical axis, contains the complementary information as to the masked orders of diffraction.

A corresponding phase-shifting element is technologically simple to realize. Because of its unhindered passthrough through the phase-shifting element, the diffracted radiation of higher order, which carries the information, experiences no negative influencing either by the configuration of the phase-shifting element or because of its holder. This negative influence could be, for example, an attenuation or additional phase shift. Furthermore, no radiation, which is diffracted in specific spatial directions, is completely masked by the holding structures. The corresponding phase-shifting element can, rather, be configured as being rotationally symmetrical to the optical axis.

Furthermore, small holes can be avoided in the phase-shifting element through which the primary beam must pass through. Negative influences from contamination effects which otherwise occur with small holes can be substantially precluded thereby; and, when only the radiation of zero diffraction order, which carries no information as to the object, passes through the phase-shifting element, the variations of the phase shift statistically cancel out because of local thickness fluctuations of the phase-shifting element.

In a further embodiment of the invention, the phase-shifting element is configured as an annular electrode whose electrostatic potential can be varied.

To generate the annularly-shaped illuminating aperture, a deflection system can be mounted in a plane conjugated to the object plane. In this embodiment, the annularly-shaped illuminating aperture is generated time sequentially by a variation of the deflection angle.

An alternate generation of the annularly-shaped illuminating aperture is possible via a corresponding diaphragm having a central cropping in the illuminating beam path. Furthermore, and especially with thermal emitters as electron sources, it is possible to image the unheated cathode image (hollow beam) (which already has an annularly-shaped emission distribution with a weak central maximum) into the forward focal plane of the condenser-objective single-field lens and to mask the central emission spot in order to generate the annularly-shaped illuminating aperture.

BRIEF DESCRIPTION OF THE DRAWINGS

The invention will now be described with reference to the drawings wherein:

FIG. 3b is a plan view of the phase plate shown in FIG. 3a;

FIG. 9a is a section view taken through a further embodiment for a phase plate; and, FIG. 9b is a plan view of the phase plate shown in FIG. 9a.

DESCRIPTION OF THE PREFERRED
EMBODIMENTS OF THE INVENTION

Figure 1:
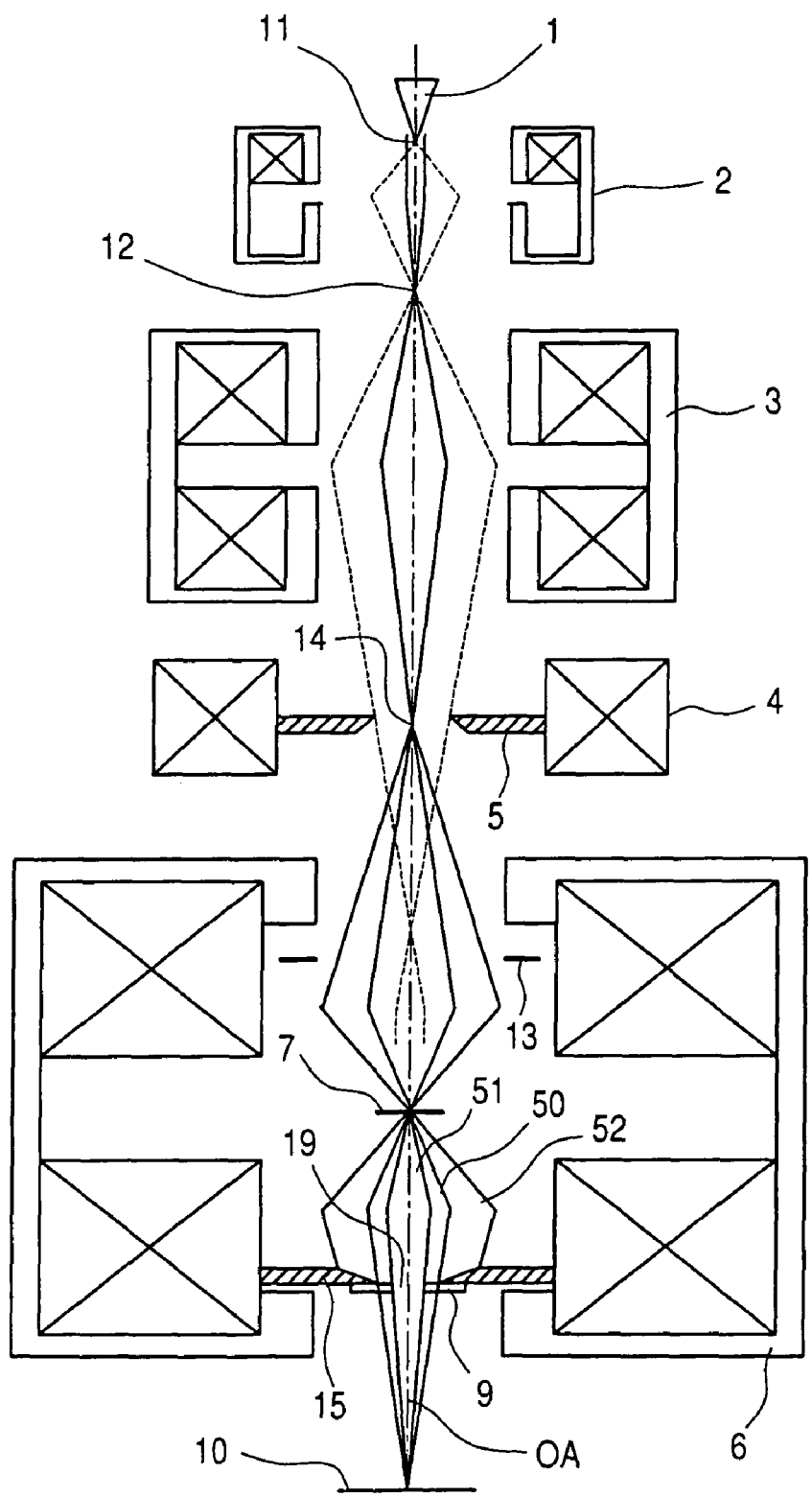
FIG. 1 shows, in section, a schematic of a particle beam apparatus according to the invention shown by way of example in the context of a transmission electron microscope.

The transmission electron microscope in FIG. 1 is shown as an example of a particle beam apparatus of the invention. The transmission electron microscope includes a beam generator 1 and a three-stage condenser (2, 3, 6). The beam generator 1 is preferably a field emission source or a Schottky-emitter. The first condenser lens 2 generates a real image 12 of the crossover 11 of the beam generator 1. This real crossover image 12 is imaged real by the follow-on second condenser lens 3 into the source-end focal plane 13 of the third condenser lens 6. The third condenser lens 6 is a so-called condenser-objective single-field lens having a prefield functioning as a condenser lens and a back field functioning as an objective lens. In the third condenser lens 6, the object plane 7 lies at the center of the pole piece gap of the condenser-objective single-field lens 6. The object plane 7 is illuminated by a particle beam aligned parallel to the optical axis because of the imaging of the crossover 11 of the particle beam generator 1 into the source-end focal plane 13 of the condenser-objective single-field lens 6. The corresponding illuminating beam path is shown by broken lines in FIG. 1.

A field diaphragm 5 and a deflection system 4 or a tilt point of a double deflection system are arranged in the source-end plane conjugated to the object plane 7. Because of the deflection system 4, the particle beam is tilted by the same angle to each point 14, which is conjugated to an object point, in the plane of the field diaphragm 5. A corresponding tilting of the particle beam in the object plane 7 is generated because of this deflection or tilting of the particle beam. Because of a charging of the deflection system 4 in two mutually perpendicular directions corresponding to a sine function in one direction and a cosine function in the direction perpendicular thereto with an amplitude constant in time and identical in both mutually perpendicular directions, a rotating beam results in the object plane 7 which corresponds to a time sequential hollow conically-shaped illuminating aperture. The inner diameter of the annularly-shaped illuminating aperture is determined and can be adjusted by setting the amplitude of the deflection generated by the deflection system 4. The annular diameter of the annularly-shaped illuminating aperture is, in contrast, determined by the imaging scale with which the crossover 11 of the particle beam generator 1 is imaged in the source-end focal plane 13 of the condenser-objective single-field lens 6.

Because of the back field or imaging field of the condenser-objective single-field lens 6, the beam cone is focused into the intermediate image plane 10 with a time-sequential hollow cone-shaped illuminating aperture so that, in the intermediate image plane 10, a real image of the object plane 7 arises. In the rearward, intermediate image end focal plane 15 of the condenser-objective single-field lens, the annularly-shaped phase-shifting element 9 is accommodated in the region of the central opening of an aperture diaphragm 8. This annularly-shaped phase-shifting element has a large central opening 19 through which the diffracted radiation of higher order 51 can pass unhindered. This diffracted radiation of higher order 51 is diffracted relative to the undiffracted beam (null beam) 50 in the direction toward the optical axis OA. The central opening 19 has a diameter of several 10 μm, preferably, at least 30 μm. At the same time, the phase-shifting element 9 imparts a phase shift of preferably π/2 to the radiation, which is not diffracted at the object, that is, to the null beam 50. At the intermediate plane 10, a superposition of the phase-shifted null beam 50 takes place with the radiation 51 diffracted in the direction onto the optical axis. Those higher diffraction orders 52 diffracted at the object are, in contrast, absorbed by the aperture diaphragm 8. The higher diffraction orders 52 run further away from the optical axis in the plane of the phase-shifting element 9 relative to the undiffracted radiation.

Figure 2:
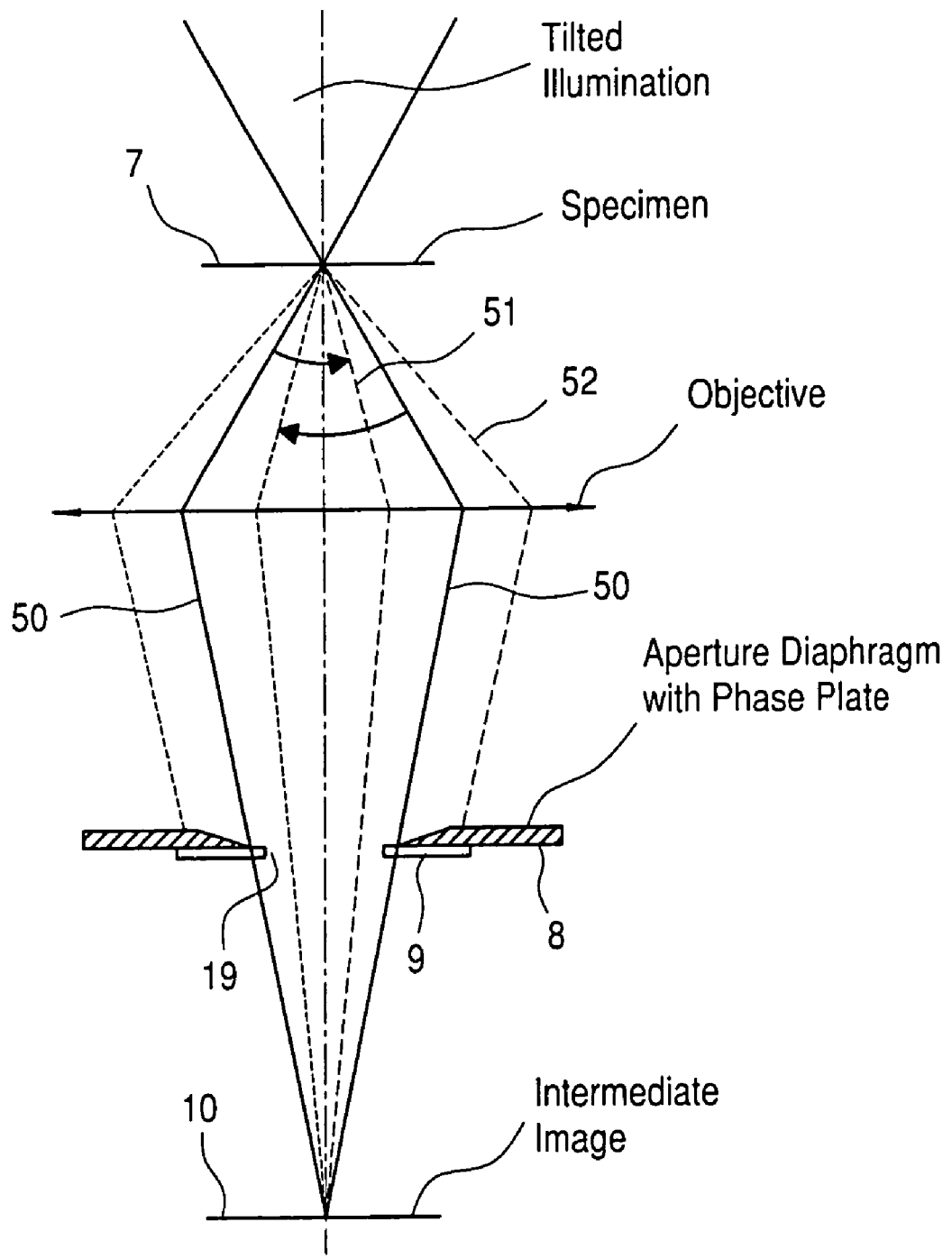
FIG. 2 is a detail view taken from FIG. 1 showing the positions of the different diffraction orders relative to the phase shifting element and the operation of the arrangement of the invention resulting therefrom.

Reference can be made to FIG. 2 with respect to the positions of the different diffraction orders relative to the phase-shifting element 9 and the operation of the arrangement of the invention resulting therefrom. In FIG. 2, the solid lines are the two null beams 50 and the dashed lines are the two plus first diffraction orders and the dotted lines are the two minus first diffraction orders of the two drawn in illumination beams. The plus first diffraction order and the minus first diffraction order 51 pass uninfluenced through the central aperture 19 in the phase-shifting element 9. The plus first diffraction order and the minus first diffraction order are closer to the optical axis in the plane of the phase-shifting element than the null beams. The null beam, which is undiffracted at the specimen, experiences the desired phase shift and the likewise desired attenuation at the annularly-shaped phase-shifting element 9 whereas both axis-remote higher diffraction orders 52 are eliminated completely by the diaphragm 8.

As shown in FIGS. 1 and 2, each point in the object plane 7 is illuminated by an electron beam which has a hollow conically-shaped illuminating aperture. The tip of illuminating beam cone lies in the object plane 7. The beam, which emanates again from the object plane, has a divergent hollow conically-shaped illuminating aperture and is imaged by the back field of the condenser-objective single-field lens 6 into the intermediate image plane 10. The higher diffraction orders 51 pass through the central opening 19 of the phase-shifting element 9. Because of the interference of these higher diffraction orders 51 with the null beam 50, which is phase shifted by the phase-shifting element, there occurs, in the intermediate image plane 10, a phase contrast image of the specimen disposed in the object plane 7. The illumination beams, which lie diametrically opposite each other, supply the diffraction information of the complementary half space. For this reason, the diffraction information as to the specimen is complete and the masking of the higher diffraction orders, which are diffracted away from the optical axis, leads only to an intensity loss by a factor of ½. This intensity loss is, however, relatively non-critical and is overcompensated by the remaining advantages of the present invention.

Figure 3A:
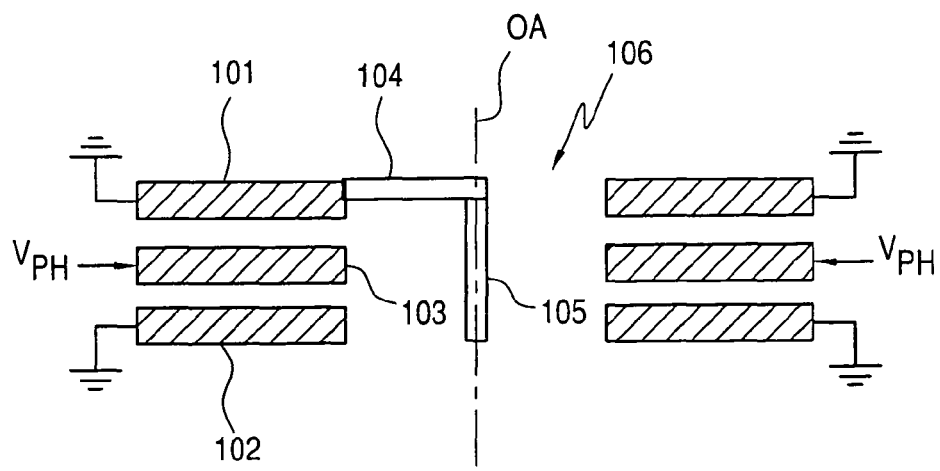
FIG. 3a is a section taken through a phase plate for a particle beam apparatus.
Figure 3B:
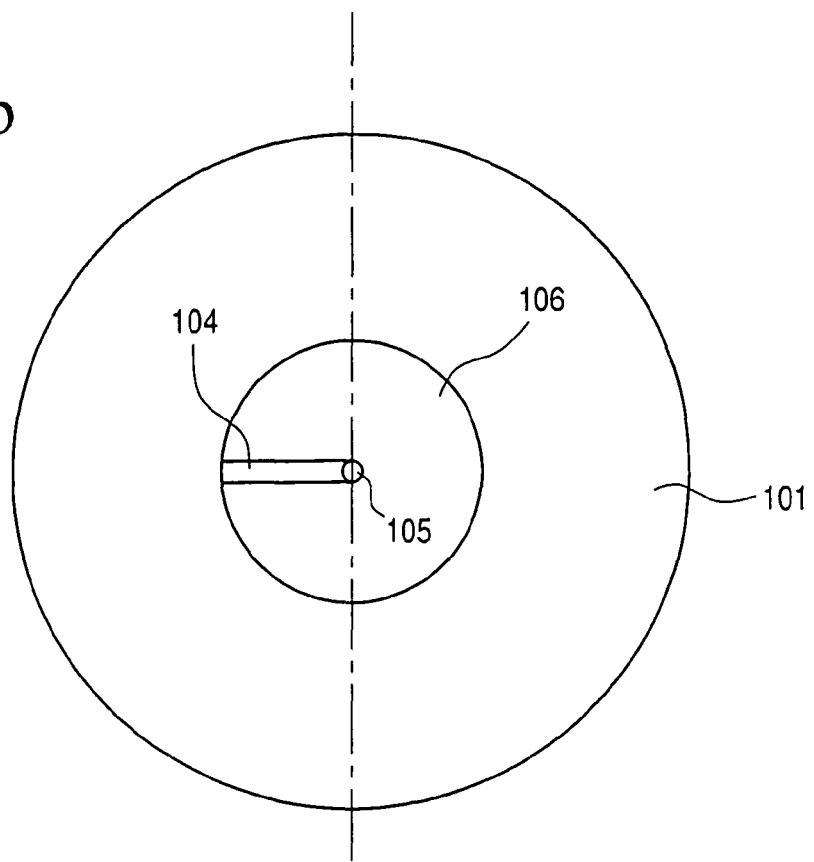

A first embodiment for a phase-shifting element is shown in FIG. 3*a* in section and in plan in FIG. 3*b*. The embodiment includes an einzel lens including two outer annularly-shaped electrodes (101, 102) and an inner annularly-shaped electrode 103 lying therebetween. The outer annularly-shaped electrodes (101, 102) are arranged one behind the other in the direction of the optical axis OA. The two outer electrodes (101, 102) are at the same electrostatic potential which corresponds to the potential in the beam tube forward and rearward of the phase-shifting element so that an electron beam, which propagates along the optical axis OA, experiences no change of energy when passing through the phase-shifting element. In the embodiment shown in FIGS. 3*a* and 3*b*, it was assumed that the electron column in the region of the phase-shifting element lies at ground potential and, accordingly, the two outer electrodes are likewise at ground potential. Furthermore, an additional electrode 105 is provided on the optical axis. In the embodiment shown in FIGS. 3*a* and 3*b*, the additional electrode 105 is accommodated on a strut 104 on one of the outer electrodes 101.

The inner electrode 103 lies at an electrostatic potential Vph which deviates from the electrostatic potential of the outer electrodes (101, 102) and generates the desired phase shift. The additional electrode 105 extends in the direction of the optical axis OA over almost the entire length of the einzel lens. With this additional electrode 105, it is ensured that electrons, whose paths run closer to the optical axis OA, pass through a different electrostatic potential than electrons whose paths run in the outer region of the passthrough opening 106. In this way, the electrons, which are diffracted at the object, experience the desired phase shift relative to the null beam. Electrons diffracted by the object run closer to the optical axis OA relative to the null beam because of the diffraction.

Because of the additional electrode 105, information is masked, but this is non-critical because this affects only very high spatial frequencies. The additional electrode 105 is accommodated on the outer electrode 101 via the strut 104. The strut 104 does cause additional information to be masked even at lower spatial frequencies; this, however, is not critical as long as the complementary range of diffraction angles is not also simultaneously cropped because then, the masked information can be reconstructed.

Figure 4:
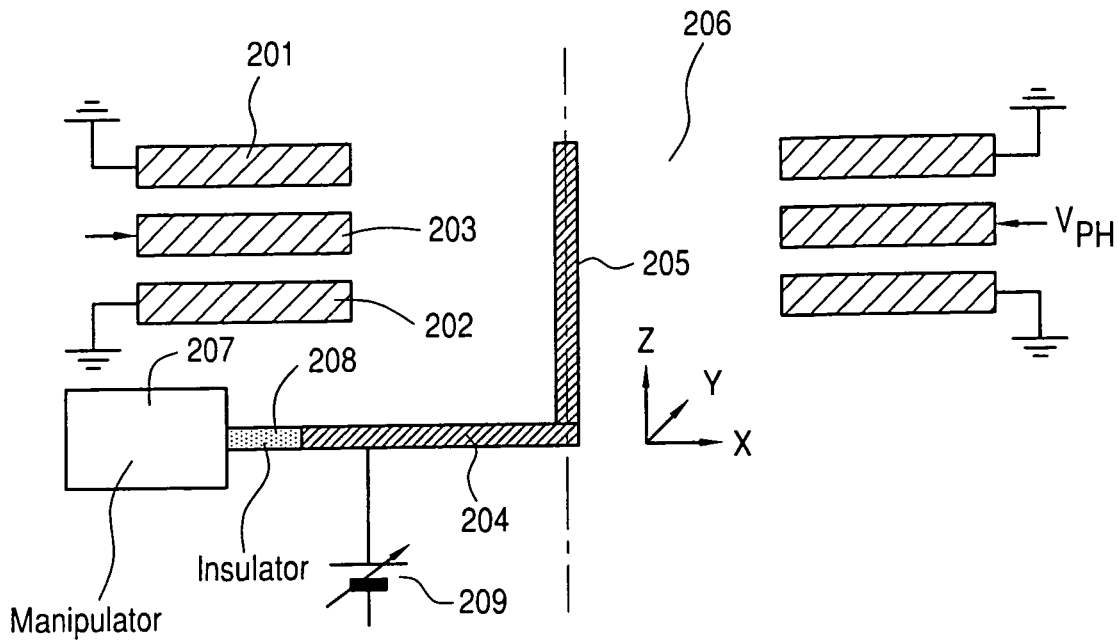
FIG. 4 is a section view taken through a second embodiment of the phase plate.

FIG. 4 shows, in section, a further embodiment of a phase-shifting element which is very similar to the embodiment shown in FIGS. 3*a* and 3*b*. Those components in FIG. 4 which correspond to the components in FIGS. 3*a* and 3*b* are identified by corresponding reference numerals increased by 100. With respect to these components of FIG. 4, which correspond to those in FIGS. 3*a* and 3*b*, reference can be made to the above description of FIGS. 3*a* and 3*b*.

In the embodiment of FIG. 4, the additional electrode 205 is accommodated via an insulator 208 on a manipulator 207. A potential can be applied to the additional electrode 205 by a voltage source 209 and this potential deviates from the potential on the outer electrodes (201, 202). The additional electrode can be positioned by the manipulator 207 in two mutually perpendicular directions perpendicular to the optical axis OA as well as in the direction of the optical axis OA. In this way, the additional electrode 205 can be centered relative to the outer electrodes (201, 202) and the inner electrode 203.

Figure 5A:
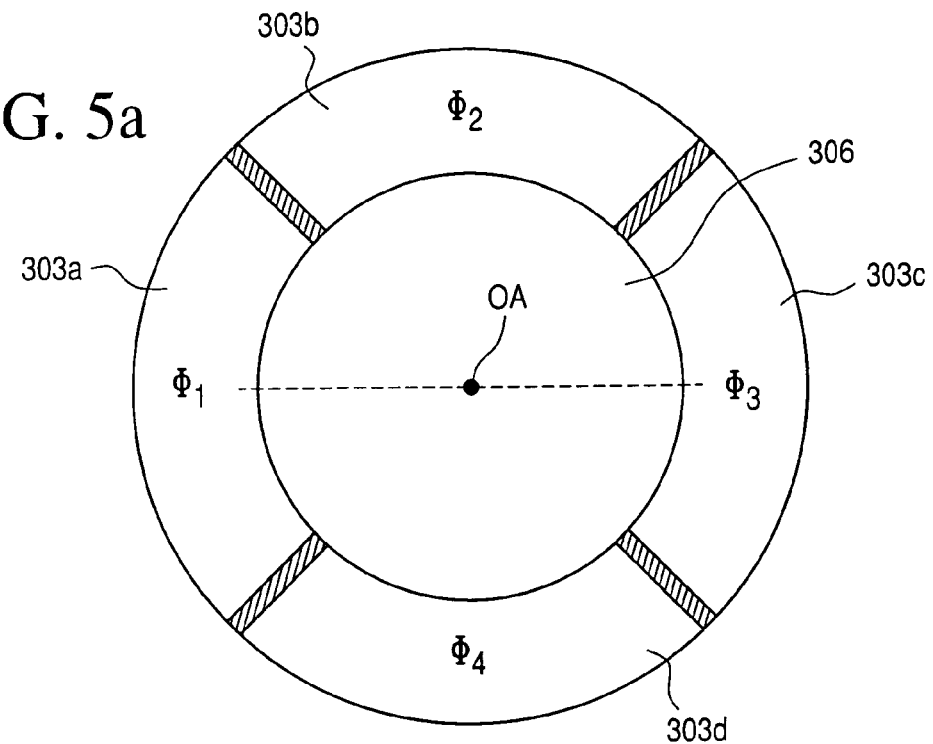
FIG. 5a is a plan view of an inner electrode for a phase plate having a segmented inner electrode.
Figure 5B:
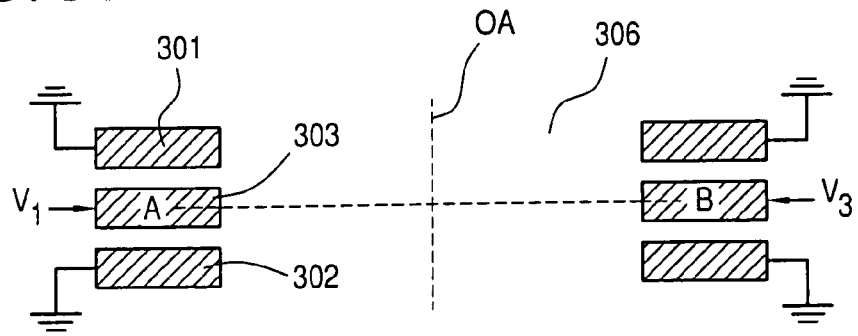
FIG. 5b shows the phase plate of FIG. 5a in section.

A further embodiment for a phase-shifting element is shown, in section, in FIG. 5*b*. FIG. 5*a* shows a plan view of the inner electrode of this phase-shifting element. The phase-shifting element or the phase plate contains, in turn, an einzel lens of two outer electrodes (301, 302) and an inner electrode 303 lying therebetween. In this embodiment, the inner electrode 303 is segmented and comprises four segments (303*a*, 303*b*, 303*c*, 303*d*) which are electrically insulated one from the other. Two segments (303*a*, 303*c*) lie opposite each other with respect to the optical axis OA and electrical potentials are applied thereto which have a polarity inverse compared to the potential of the outer electrodes (301, 302). When the outer electrodes are at ground potential, then a segment 303*a* is, for example, at +Vph and the segment 303*c*, which lies opposite relative to the optical axis OA, is at the same potential in magnitude but is at a negative potential −Vph. By applying inverse potentials to the opposite-lying segments, the situation is achieved that, as in the embodiment of FIGS. 3*a* and 3*b*, a zero crossover is imparted to the electrostatic potential at the optical axis. Compared to the embodiment in FIGS. 3*a* and 3*b*, this embodiment affords the advantage that carrier elements and electrodes, which project into the interior space 306 of the einzel lens and mask information, can be avoided.

The potential distribution, which is generated with a segmented inner electrode 303, causes, in the case of a static illumination cone, that the electrons, which are scattered in various half spaces, experience an inverse phase shift with respect to each other. For example, electrons scattered in the positive half space experience a positive phase shift; whereas, electrons scattered in the negative half space experience a negative phase shift. In this way, a differential interference contrast (DIC) or a Hilbert phase contrast arises which generates a plastic image impression. The true image can be obtained again with the aid of an image reconstruction.

Figure 6:
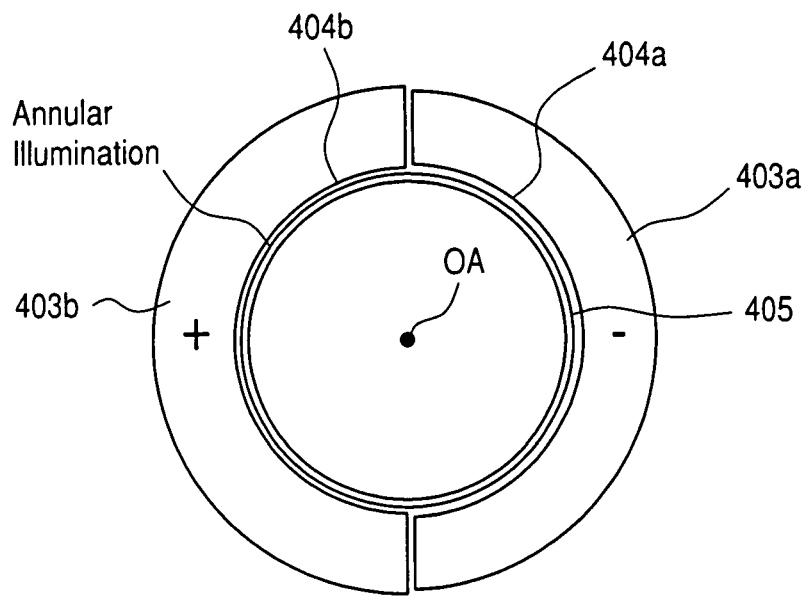
FIG. 6 is a plan view of an inner electrode for a further embodiment for a phase plate having a segmented inner electrode.

FIG. 6 shows a plan view of an inner electrode of an embodiment for a phase-shifting element wherein the inner electrode has two segments (403*a*, 403*b*) electrically insulated from each other. The inner edge 404*a* of a segment 403*a* is spaced further away from the optical axis OA than the inner edge 404*b* of the other segment 403*b*. Potentials inverse to each other are, in turn, applied to the two segments (403*a*, 403*b*). Relative to the outer electrodes (not shown in FIG. 6) a positive potential is applied to the segment 403*b* whose inner edge lies closer to the optical axis. Since the annularly-shaped illuminating beam 405 in the half space next to the positive electrode runs closer to the electrode than in the half space, which is next to the negative electrode 403*a*, the null beam experiences a greater phase shift in the half space next to the positive electrode 403*b* than in the half space next to the negative electrode 403*a*. A Zernicke phase contrast arises when the phase shift, which is defined by the respective potentials, is so adjusted that the phase shift, which the null beam experiences, amounts to $3\pi/2$ in the half space which is adjacent the positive electrode 403*b* and amounts to $\pi/2$ in the half space next to the negative electrode 403*a*.

The remaining configuration of the phase-shifting element corresponds to the embodiment shown in FIG. 5*b*, that is, the inner electrode is mounted between two outer electrodes which lie at the electrical potential of the electron column forward and rearward of the einzel lens.

Figure 7:
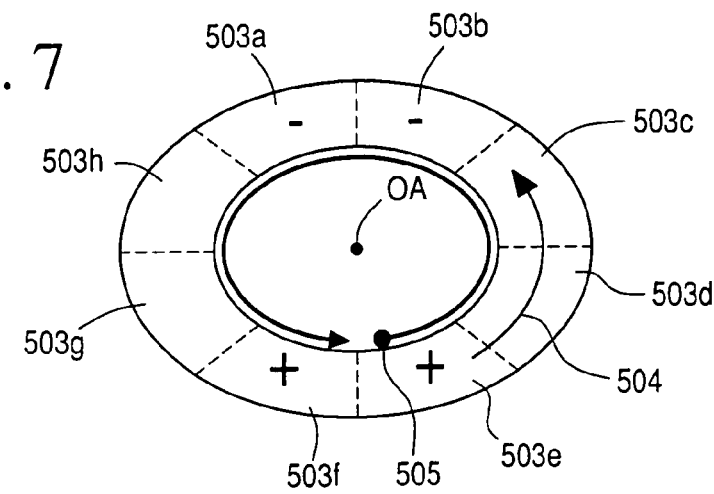
FIG. 7 is a plan view of an inner electrode for a further embodiment for a phase plate having a segmented inner electrode.

FIG. 7 shows a plan view of an inner electrode of an embodiment wherein the inner electrode has a greater number of mutually electrically insulated segments (503*a* to 503*h*). With this electrode too, inverse electrical potentials +Vph and −Vph are applied to segments (503*e*, 503*f*, 503*a*, 503*b*) lying opposite each other with reference to the optical axis OA. The potentials applied to the individual segments are such that the potential charge runs about in a circle in the direction of arrow 504. The rotation frequency for the application of potential to the inner electrode is identical to the rotation frequency of the hollow conical illumination when this is generated dynamically and the electron beam is guided sequentially along a hollow cone by means of a deflection system. A rotating phase plate results from the circulating or rotating application of potential. The phase shift imparted by the phase plate to the unscattered beam (which ideally amounts to n/2) rotates in a circle synchronously to the movement of the null beam 505. Because of the inverse application of potential to opposite-lying segments, there results, in turn, the situation that the potential has a zero crossover at the optical axis OA.

The remaining configuration of the phase-shifting element corresponds to the embodiment of FIG. 5*b*, that is, the inner electrode is mounted between two outer electrodes which are at the same electrical potential as the electron column forward and rearward of the einzel lens.

It is here noted that the phase plates can also be used when the electron-optical column in the region of the phase plate should lie at an electrical potential Vo deviating from ground potential. In this case, the outer electrodes lie at this potential forward and rearward of the phase plate and this constant potential Vo is supplied to the rotating potential charge as an offset so that the segments (503*a*, 503*b*) as well as segments (503*e*, 503*f*), which lie opposite each other with reference to the optical axis OA, are charged with the potential Vo+Vph and Vo−Vph and the remaining segments (503*c*, 503*d*, 503*g*, 503*h*) are charged with the potential Vo.

The null beam experiences a phase shift even with the use of this phase-shifting element while the phase of the radiation, which is diffracted at the object, remains entirely or virtually uninfluenced.

In the embodiments described above, the phase-shifting element imparts a phase shift in each case to the null beam while the radiation, which is diffracted at the object remains substantially uninfluenced by the phase plate. However, for the generation of the phase contrast, only the relative phase shift between the null beam and the radiation diffracted at the object is relevant. For this reason, the diffracted radiation also can be shifted in the phase while the null beam remains uninfluenced or experiences only a slight phase shift.

Figure 8:
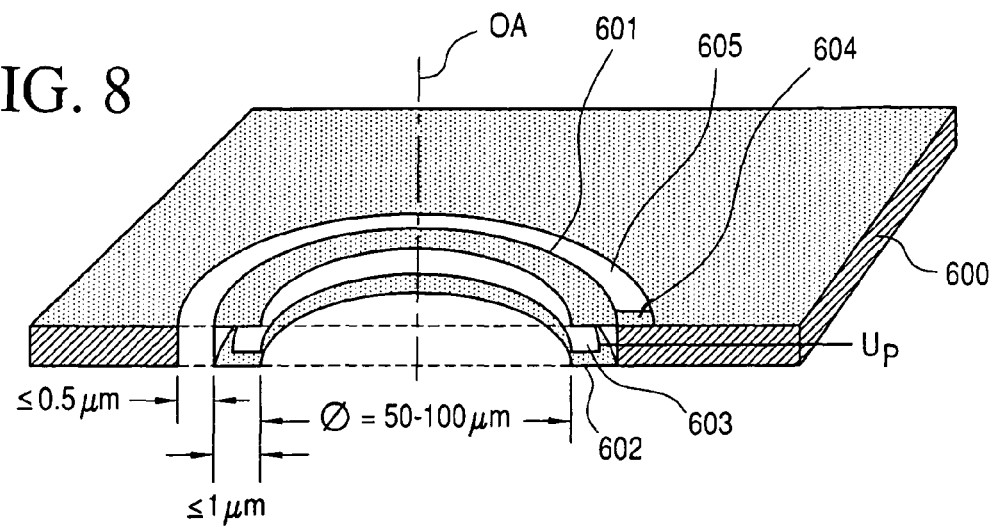
FIG. 8 is a perspective view of a further embodiment of a phase plate shown in section.

FIG. 8 is a perspective view, in section, of an embodiment for a phase-shifting element which imparts a phase shift to the radiation diffracted at the object. It includes an einzel lens having two outer electrodes (601, 602) and an inner electrode 603 mounted therebetween. The inner electrode 603 is electrically insulated relative to the two outer electrodes (601, 602) and lies at the potential Up which is necessary for phase shifting relative to the outer electrodes (601, 602). The einzel lens is mounted within a circularly-shaped hole of a plate 600 of electrically conductive material via an annularly-shaped air gap 605. The plate 600 and the two outer electrodes 601 and 602 of the einzel lens lie at the same potential. The einzel lens is accommodated on the plate 600 via one or several holding struts 604 via which also the potential supply takes place for the inner electrode 603.

The inner clear diameter of the einzel lens should be approximately 50 to 100 μm. The annularly-shaped electrodes of the einzel lens should be as thin as possible and be at most 1 μm thick and the annularly-shaped gap 605 should have a gap width of below 0.5 μm.

The outer electrodes (601, 602) of the einzel lens lie at the same potential as the plate 600. For this reason, the annularly-shaped gap is free of potential. The null beam, which passes through the gap 605, therefore experiences no phase shift. The radiation, which is diffracted at the object and diffracted in the direction of the optical axis and runs through the interior of the electrostatic einzel lens, is, in contrast, shifted in phase by the potential of the inner electrode 603.

Compared to the embodiments wherein the null beam is shifted in phase, this arrangement has the disadvantage that shading of a spatial frequency range unavoidably takes place because of the electrodes (601, 602, 603) of the einzel lens.

The inner electrode 603 can also be segmented in the embodiment of FIG. 8 and the individual segments can be charged with a rotating potential distribution so that this system too can be used with a dynamic hollow conical illumination wherein the potential applied to the inner electrode is identical to that of the rotation of the hollow cone illumination. Because of the rotating potential charging, there results, in turn, a rotating phase plate.

Figure 9A:
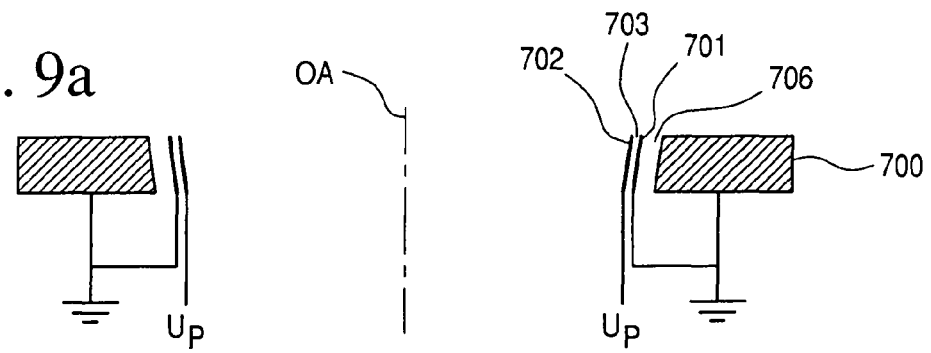
Figure 9B:
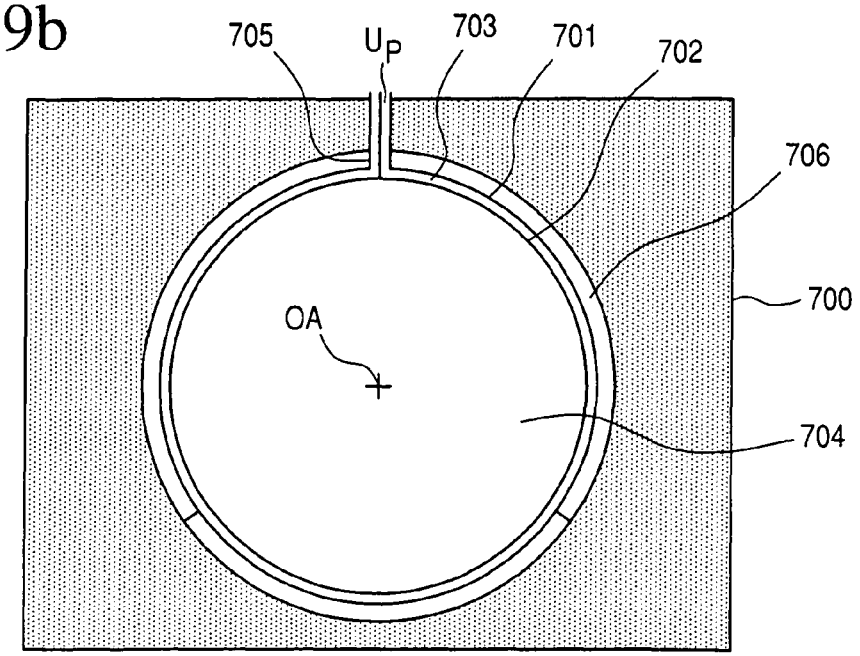

A further embodiment of a phase plate is shown, in section, in FIG. 9*a* and a plan view is shown in FIG. 9*b*. The embodiment of FIGS. 9*a* and 9*b* also includes a plate 700 having a circularly-shaped hole 704 as in the embodiment of FIG. 8. Two annularly-shaped electrodes (701, 702) are accommodated in the hole 704 via one or several holding struts 705. The electrodes (701, 702) are arranged mutually coaxially to the optical axis OA and are insulated with respect to each other by an insulating layer 703. A clear annularly-shaped gap 706 is disposed between the two annularly-shaped electrodes (701, 702) and the plate 700 for the passthrough of the null beam. The outer one of the two annularly-shaped electrodes 701 lies at the same electrical potential as the plate and the inner annularly-shaped electrode 702 lies at the potential Up which deviates relative thereto and which functions for the phase shift of the electron beams diffracted at the object at higher diffraction orders. As in the embodiment of FIG. 8, the annularly-shaped gap 706 is free of potential so that the null beam experiences no phase shift.

The insulating layer 703 does not have to be completely annularly-shaped and can, instead, comprise also an air gap. Only for reasons of stability, solid insulators should be used at some locations. The number or the size of the solid insulators should be as small as possible because the insulators can easily become charged.

Also in this embodiment of the phase plate, the radiation, which is deflected toward the optical axis in higher diffraction orders, experiences a phase shift whereas the null beam, which passes through the annularly-shaped gap 706, is entirely or at least substantially uninfluenced by the phase plate.

Based on the embodiments, the invention was explained herein in the context of an example of an electron microscope. The invention can also be utilized for particle beam apparatus having positively charged particles such as ions or positrons, for example, helium ions. The invention is especially usable in a transmission ion microscope. In FIG. 1, the magnetic lenses would then be replaced with electrostatic lenses. At the same time, the electron source would be replaced by an ion source such as a field ion source and the acceleration potentials would be correspondingly inverted. The phase plates shown in FIGS. 3a and 9b can, in contrast, remain unchanged also for a use in an ion microscope or a positron microscope.

It is understood that the foregoing description is that of the preferred embodiments of the invention and that various changes and modifications may be made thereto without departing from the spirit and scope of the invention as defined in the appended claims.

What is claimed is:

1. A particle beam apparatus defining an optical axis and comprising:
    an illuminating system for illuminating an object to be positioned in an object plane with a beam of charged particles which splits into a null beam and higher diffraction orders at said object;
    an objective arranged along said optical axis for imaging said object illuminated by said illuminating system;
    said illuminating system being configured to generate, during operation, an annularly-shaped illuminating aperture in a plane fourier transformed to said object plane;
    said objective having a focal plane facing away from said object plane;
    a phase-shifting element mounted in said focal plane or a plane conjugated thereto;
    said phase-shifting element including an einzel lens having first and second outer electrodes arranged along said optical axis and an inner electrode arranged therebetween;
    said electrodes being arranged and charged with electrical potential, during operation, so as to cause the potential at said optical axis to correspond to the potential at said first and second outer electrodes of said einzel lens; and,
    wherein said phase-shifting element further comprises an ancillary electrode on or near said optical axis.

2. The particle beam apparatus of claim 1, wherein said ancillary electrode is charged with the potential of said first and second outer electrodes.

3. The particle beam apparatus of claim 2, further comprising a manipulator for holding said ancillary electrode and positioning said ancillary electrode perpendicularly to the direction of said optical axis.

4. The particle beam apparatus of claim 1, wherein said phase-shifting element is configured to impart, during operation, a phase shift to said null beam relative to said higher diffraction orders; and, said phase-shifting element is further configured to, during operation, not influence or only slightly influence said higher diffraction orders running closer to said optical axis than said null beam.

5. A particle beam apparatus defining an optical axis and comprising:
    an illuminating system for illuminating an object to be positioned in an object plane with a beam of charged particles which splits into a null beam and higher diffraction orders at said object;
    an objective arranged along said optical axis for imaging said object illuminated by said illuminating system;
    said illuminating system being configured to generate, during operation, an annularly-shaped illuminating aperture in a plane fourier transformed to said object plane;
    said objective having a focal plane facing away from said object plane;
    a phase-shifting element mounted in said focal plane or a plane conjugated thereto;
    said phase-shifting element including an einzel lens having first and second outer electrodes arranged along said optical axis and an inner electrode arranged therebetween;
    said electrodes being arranged and charged with electrical potential, during operation, so as to cause the potential at said optical axis to correspond to the potential at said first and second outer electrodes of said einzel lens;
    wherein said inner electrode comprises a plurality of segments;
    potentials of opposite polarity are applied to respective ones of each two of said segments lying mutually opposite each other with reference to said optical axis; and,
    wherein said plurality of segments are electrically insulated from each other.

6. The particle beam apparatus of claim 5, further comprising a deflection system for time sequentially generating said annularly-shaped illumination aperture; said deflection system being mounted in a plane conjugated to said object plane on the side thereof facing toward said illumination system; and, a voltage supply configured to cause a potential to be applied to said segments alternately or rotatingly.

7. The particle beam apparatus of claim 5, wherein said inner electrode comprises two segments lying opposite each other with respect to the optical axis and having respective edges facing toward said optical axis; and, said edges are at different distances from said optical axis.

8. The particle beam apparatus of claim 7, further comprising a deflection system for time sequentially generating said annularly-shaped illumination aperture; said deflection system being mounted in a plane conjugated to said object plane on the side thereof facing toward said illumination system; and, a voltage supply configured to cause a potential to be applied to said segments alternately or rotatingly.

9. A particle beam apparatus defining an optical axis and comprising:
    an illuminating system for illuminating an object to be positioned in an object plane with a beam of charged particles which splits into a null beam and higher diffraction orders at said object;
    an objective arranged along said optical axis for imaging said object illuminated by said illuminating system;
    said illuminating system being configured to generate, during operation, an annularly-shaped illuminating aperture in a plane fourier transformed to said object plane;
    said objective having a focal plane facing away from said object plane;
    a phase-shifting element mounted in said focal plane or a plane conjugated thereto;
    said phase-shifting element including a carrier; and, an annularly-shaped electrode accommodated in said carrier;
    said annularly-shaped electrode having a side facing away from said optical axis in a radial direction;
    said electrode having an edge on said side thereof;
    said edge and said carrier conjointly defining an annular gap therebetween wherein said phase-shifting element imparts a phase shift to the beam of charged particles split into higher diffraction orders in response to a potential applied thereto; and, wherein said phase-shifting element does not influence, or only slightly influences, said null beam.

10. The particle beam apparatus of claim 9, wherein said annularly-shaped electrode is a first annularly-shaped electrode; said phase-shifting element further comprises a second annularly-shaped electrode; and, said first and second annularly-shaped electrodes are electrically insulated from each other.

11. The particle beam apparatus of claim 10, wherein said second annularly-shaped electrode is arranged radially outside of said first annularly-shaped electrode; and said carrier is at a potential and, during operation, said potential of said carrier is applied to said second annularly-shaped electrode; and wherein said particle beam apparatus further comprises a voltage source for applying a potential to said first annularly-shaped electrode deviating from said potential of said carrier.

12. The particle beam apparatus of claim 11, wherein one of said first and second annularly-shaped electrodes comprises a plurality of annularly-shaped segments; and wherein said particle beam apparatus further comprises: a deflection system for time sequentially generating said annularly-shaped illumination aperture; said deflection system being mounted in a plane conjugated to said object plane on the side thereof facing toward said illumination system; and, a voltage supply configured to cause a potential to be applied to said segments alternately or rotatingly.

13. The particle beam apparatus of claim 9, wherein said phase-shifting element comprises a plurality of said annularly-shaped electrodes accommodated in said carrier; said annularly-shaped electrodes have respective sides facing away from said optical axis in a radial direction; said electrodes have respective edges on corresponding ones of said sides thereof; and, said edges and said carrier conjointly define respective annular gaps therebetween.

14. The particle beam apparatus of claim 13, wherein each one of said plurality of annularly-shaped electrodes comprises a plurality of annularly-shaped segments.

* * * * *

UNITED STATES PATENT AND TRADEMARK OFFICE
CERTIFICATE OF CORRECTION

| | | |
|---|---|---|
| PATENT NO. | : 8,299,442 B2 | Page 1 of 1 |
| APPLICATION NO. | : 12/461481 | |
| DATED | : October 30, 2012 | |
| INVENTOR(S) | : Gerd Benner | |

It is certified that error appears in the above-identified patent and that said Letters Patent is hereby corrected as shown below:

In Column 6:
Line 48: delete "n/2" and substitute -- $\pi/2$ -- therefor.

In Column 9:
Line 34: delete "n/2" and substitute -- $\pi/2$ -- therefor.

Signed and Sealed this
Twenty-fifth Day of December, 2012

David J. Kappos
*Director of the United States Patent and Trademark Office*